(12) United States Patent
Hayashi

(10) Patent No.: US 7,005,340 B2
(45) Date of Patent: Feb. 28, 2006

(54) METHOD FOR MANUFACTURING SEMICONDUCTOR DEVICE

(75) Inventor: Masahiro Hayashi, Sakata (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/382,357

(22) Filed: Mar. 5, 2003

(65) Prior Publication Data

US 2003/0228731 A1   Dec. 11, 2003

(30) Foreign Application Priority Data

Mar. 6, 2002   (JP) .............................. 2002-060489

(51) Int. Cl.
*H01L 21/8238*   (2006.01)
(52) U.S. Cl. ...................... 438/224; 438/223; 438/227; 438/228; 438/514; 438/522; 438/519; 438/546
(58) Field of Classification Search ................ 438/223, 438/224, 227, 228, 301, 305, 306, 369, 370, 438/514, 522, 519, 526, 527, 530, 531, 546, 438/551, 560
See application file for complete search history.

(56) References Cited

U.S. PATENT DOCUMENTS

| | | | | | |
|---|---|---|---|---|---|
| 4,268,321 | A | * | 5/1981 | Meguro ...................... | 438/227 |
| 4,584,027 | A | * | 4/1986 | Metz et al. .................. | 438/527 |
| 4,697,332 | A | * | 10/1987 | Joy et al. .................... | 438/420 |
| 5,663,086 | A | * | 9/1997 | Rostoker et al. ............ | 438/210 |
| 5,698,458 | A | * | 12/1997 | Hsue et al. .................. | 438/451 |
| 5,702,988 | A | * | 12/1997 | Liang .......................... | 438/238 |
| 6,063,690 | A | * | 5/2000 | Woodruff et al. ........... | 438/426 |
| 6,097,078 | A | * | 8/2000 | Sim et al. .................... | 257/548 |
| 6,342,719 | B1 | * | 1/2002 | Arai ............................ | 257/371 |
| 6,459,104 | B1 | * | 10/2002 | Schuegraf ................... | 257/197 |
| 6,531,356 | B1 | * | 3/2003 | Hayashi ...................... | 438/228 |

FOREIGN PATENT DOCUMENTS

| | | |
|---|---|---|
| JP | 01-268171 | 10/1989 |
| JP | 07-078881 | 3/1995 |
| JP | 08-274268 | 10/1996 |
| JP | 2000-286346 | 10/2000 |
| JP | 2000-294742 | 10/2000 |
| JP | 2001-291678 | 10/2001 |
| JP | 2001-291679 | 10/2001 |
| JP | 2001-291786 | 10/2001 |

* cited by examiner

*Primary Examiner*—Maria F. Guerrero
(74) *Attorney, Agent, or Firm*—Harness, Dickey & Pierce, P.L.C.

(57) ABSTRACT

A method is provided for manufacturing a semiconductor device that can reduce the number of steps in manufacturing a triple-well that includes multiple ion implantation steps and heat treatment steps. The method comprises the steps of: (a) forming a first mask layer having a first opening section on a semiconductor substrate; (b) forming a first dielectric layer on an exposed surface of the semiconductor substrate in the first opening section; (c) forming an impurity layer by introducing a first impurity of a second conductivity type in the semiconductor substrate through the first dielectric layer; (d) conducting a heat treatment to form a first well, and a second dielectric layer on the exposed surface of the semiconductor substrate in the first opening section; (e) forming a second mask layer having a second opening section on the first mask layer; and (f) forming a second well within the first well by introducing a second impurity of the first conductivity type in the semiconductor substrate through the second dielectric layer.

7 Claims, 3 Drawing Sheets

METHOD FOR MANUFACTURING SEMICONDUCTOR DEVICE

TECHNICAL FIELD

The present invention relates to a method for manufacturing a semiconductor device having a triple-well.

BACKGROUND

A semiconductor device having a triple-well can achieve a higher speed operation due to the fact that its back gate voltage can be reduced and parasitic capacitance can be reduced by, for example, optimizing a bias state of a p-type well and an n-type well. Formation of such a triple well structure normally includes multiple ion implantation steps and heat treatment steps, which amount to a large number of steps, and therefore the reduction of these steps is desired.

An object of the present invention is to reduce the number of steps in manufacturing a triple-well that includes multiple ion implantation steps and heat treatment steps.

SUMMARY

A method for manufacturing a semiconductor device in accordance with the present invention comprises the steps of:

forming a first mask layer having a first opening section on a semiconductor substrate of a first conductivity type;

forming a first dielectric layer having a specified film thickness on an exposed surface of the semiconductor substrate in the first opening section;

forming an impurity layer by introducing a first impurity of a second conductivity type by an ion implantation in the semiconductor substrate through the first dielectric layer using the first mask layer as a mask;

conducting a heat treatment to form a first well by re-distributing the first impurity of the impurity layer, and a second dielectric layer having a specified film thickness on the exposed surface of the semiconductor substrate in the first opening section;

forming a second mask layer having a second opening section that is located at a specified position in the first opening section on the first mask layer; and forming a second well within the first well by introducing a second impurity of the first conductivity type by an ion implantation in the semiconductor substrate through the second dielectric layer using the second mask layer as a mask.

In the present invention, the first dielectric layer and the second dielectric layer function as protective films to prevent the surface of the semiconductor substrate from being damaged by ions in the ion implanting step. Therefore, the first and second dielectric layers may preferably be provided with a film thickness that can prevent the surface of the semiconductor substrate from being damaged by the ion implantation, and yet sufficiently ensures the ion implanting efficiency.

In accordance with the present invention, the second dielectric layer that is formed in the process of forming the first well can be used without modification as a protective film in the ion implantation in the process of forming the second well. Accordingly, for example, the steps of forming a triple well can be reduced compared to the case where a dielectric layer formed on a surface of the semiconductor substrate in forming a first well is removed, and then a protective dielectric layer necessary for the formation of a second well is formed anew.

The manufacturing method in accordance with the present invention can assume a variety of modifications as follows.

The first dielectric layer may be formed by thermally oxidizing the semiconductor substrate, and the second dielectric layer may be formed by further thermally oxidizing the semiconductor substrate in a state under the presence of the first dielectric layer. The thermal oxidation can be accomplished by heat treating the semiconductor substrate in a state in which, for example, nitrogen gas and oxygen gas coexist.

A film thickness of the second dielectric layer may be controlled by a partial pressure of oxygen in the heat treatment of the step (d). In other words, when the partial pressure of oxygen is small, the film thickness of the second dielectric layer is not that much different from the film thickness of the first dielectric layer; and as the partial pressure of oxygen becomes larger, the film thickness of the second dielectric layer becomes greater.

When oxygen does not exist in the atmosphere in the heat treatment in the step (d), the semiconductor substrate is not thermally oxidized, and therefore the second dielectric layer is substantially identical to the first dielectric layer.

The first mask layer may be composed of a silicon oxide layer, and the second mask layer may be composed of a resist layer. By forming the first mask layer from silicon oxide, the first and second dielectric layers can be formed with good control.

The step (f) may further include the step of conducting a heat treatment to re-distribute the second impurity. The second well can be formed only with an ion implantation, or with an ion implantation and redistribution of impurity by a heat treatment. When conducting such a heat treatment, the step of removing the second mask layer may be included before the heat treatment. According to this step, when the second mask includes organic material like a resist layer, generation of contaminating substances resulting from the heat treatment can be prevented by removing the second mask layer.

In the step (d), a concave section may be formed in a surface of the semiconductor substrate by forming the second dielectric layer. Such a concave section is formed through consumption of material in the surface of the semiconductor substrate by the heat treatment. The concave section can serve as, for example, an index for mask positioning in the later step of forming an element isolation layer.

DETAILED DESCRIPTION

An example of an embodiment of the present invention will be described below with reference to the accompanying drawings.

FIGS. 1–6 show cross-sections to describe a manufacturing method in the order of the process in accordance with the present embodiment. Each of the figures shows a schematic presentation, and for example, the film thickness of the first and second dielectric layers is shown to be thicker than the actual thickness, as compared to other layers.

Figure 1:
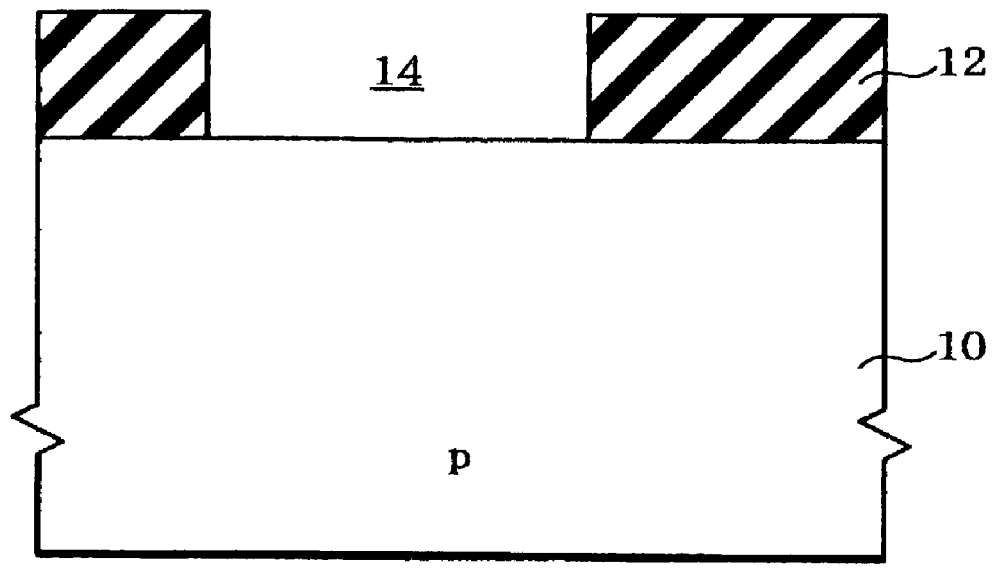
FIG. 1 shows a cross-sectional view of an embodiment of the present invention, and shows a state in which a first mask layer is formed on a semiconductor substrate.

(a) As shown in FIG. 1, a first mask layer 12 having a first opening section 14 is formed on a semiconductor substrate 10 of a first conductivity type (a silicon substrate in this example). In this example, the first conductivity type is p-type, and a second conductivity type is n-type. The first mask layer 12 may be formed from a silicon oxide layer, for example. By forming the first mask layer 12 from a silicon oxide layer, first and second dielectric layers to be formed later can be formed with good control. Also, the first opening section 14 corresponds to a deep first well region that composes a triple well.

Figure 2:
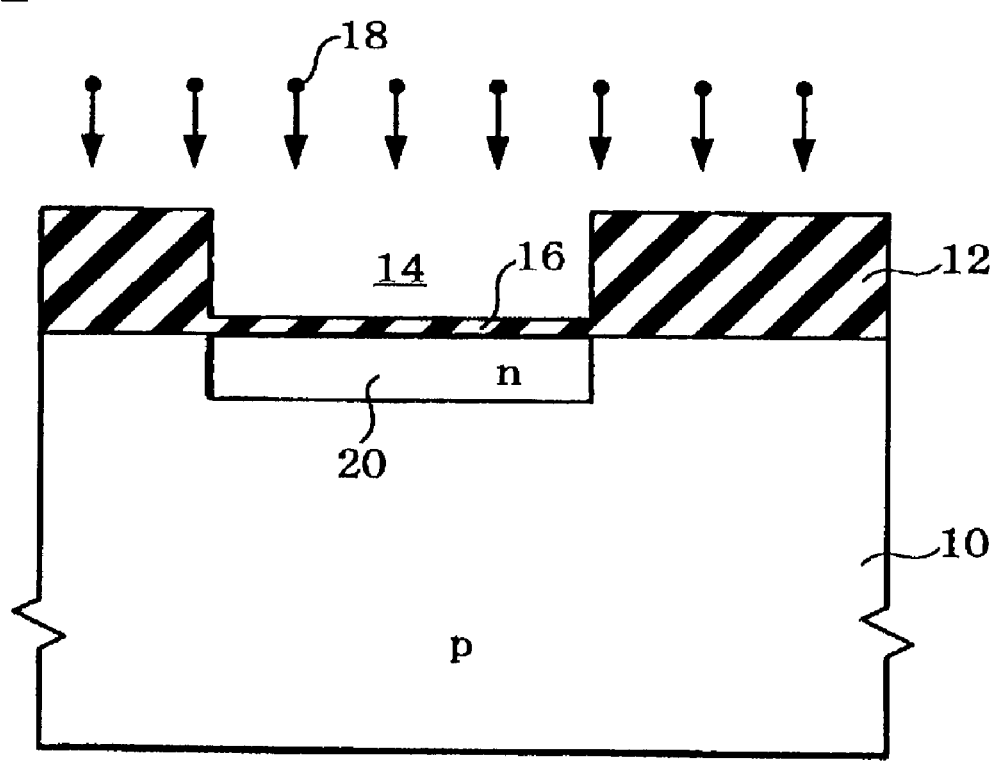
FIG. 2 shows a cross-sectional view of the embodiment of the present invention, and shows a state in which an impurity layer is formed in the semiconductor substrate by implanting ions.

(b) As shown in FIG. 2, a first dielectric layer 16 is formed on an exposed surface of the semiconductor substrate 10 in the first opening section 14 of the first mask layer 12. The first dielectric layer 16 is formed by heating the semiconductor substrate 10 in a nitrogen atmosphere including oxygen. In other words, the first dielectric layer 16 is formed as a substance composing the semiconductor substrate 10 (silicon in this example) as oxidized by thermal oxidation.

The first dielectric layer 16 functions as a protective film for the semiconductor substrate 10 in an ion implanting step to be conducted next. Therefore, the first dielectric layer 16 is set to have a film thickness that appropriately maintains the implanting efficiency in the ion implantation and yet prevents the surface of the semiconductor substrate 10 from being damaged by the ions that are implanted. The film thickness of the first dielectric layer 16 may be appropriately set by the type of ions to be implanted, the implanting energy, the depth of the first well, and the like.

(c) As shown in FIG. 2, a first impurity 18 of the second conductivity type (n-type) is ion-implanted in the semiconductor substrate 10 through the first dielectric layer 16, using the first mask layer 12 as a mask to thereby form an impurity layer 20. For example, phosphorous or arsenic may be used as the n-type impurity.

The oxygen that is used in this heat treatment step is used as an oxygen source in the thermal oxidation of the first dielectric layer 16 as described above. Also, by monitoring the film thickness of the thermally oxidized film that composes the first dielectric layer 16, heat management in the heat treatment step can be conducted. Therefore, a partial pressure of oxygen in this step is set in view of the thermal oxidation of the semiconductor substrate 10 (silicon substrate) and the heat management.

Figure 3:
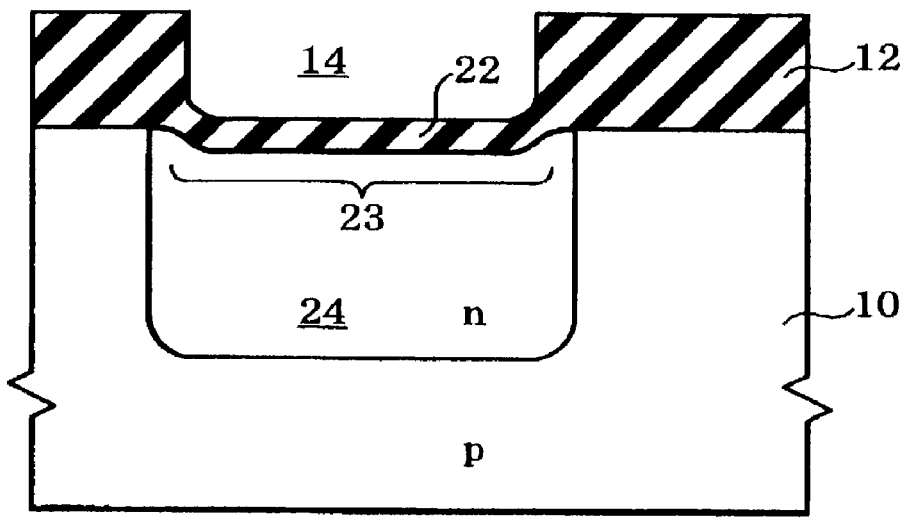
FIG. 3 shows a cross-sectional view of the embodiment of the present invention, and shows a state in which a first well is formed in the semiconductor substrate.

(d) As shown in FIG. 3, a heat treatment is conducted in a nitrogen atmosphere including oxygen to re-distribute the impurity of the impurity layer 20 (see FIG. 2) to form a first well 24. At this time, since the heat treatment is conducted in a nitrogen atmosphere including oxygen, thermal oxidation of the surface of the semiconductor substrate 10 (silicon substrate) progresses with the presence of the first dielectric layer 16 indicated in FIG. 2, such that a second dielectric layer 22 having a greater film thickness than that of the first dielectric layer 16 is formed. The oxygen that is used in this heat treatment step is mainly used to conduct heat management in the heat treatment step, which can be achieved by monitoring the film thickness of the thermally oxidized film. Therefore, if the heat management in the heat treatment step can be conducted by another means, oxygen is not necessarily required. A partial pressure of oxygen that is used in this heat treatment step may preferably be smaller than a partial pressure of oxygen in step (b) described above in order to control the film thickness of the second dielectric layer 22 to a specified value. For example, when the partial pressure of oxygen is 100% when a silicon oxide layer having a film thickness of 80 nm is formed by the heat treatment at a temperature of 1000° C. for 2 hours in step (b) described above, the partial pressure of oxygen can be 2% in this step (d), when a silicon oxide layer having a film thickness of 800 nm is formed by the heat treatment at a temperature of 1200° C. for 8 hours.

The second dielectric layer 22 functions as a protective film in an ion implantation to be conducted later, like the first dielectric layer 16 shown in FIG. 2. Therefore, the second dielectric layer 22 is set to have a film thickness that appropriately maintains the implanting efficiency in the ion implantation and yet prevents the surface of the semiconductor substrate 10 from being damaged by the ions that are implanted.

In this heat treatment, when the second dielectric layer 22 is formed, a concave section 23 may be formed in the surface of the semiconductor substrate 10 because silicon in the surface of the semiconductor substrate 10 is consumed. In this case, the concave section 23 can be optically recognized, and therefore can be used later as an index for positioning a mask, for example, a mask that is used for forming an element isolation layer.

Figure 4:
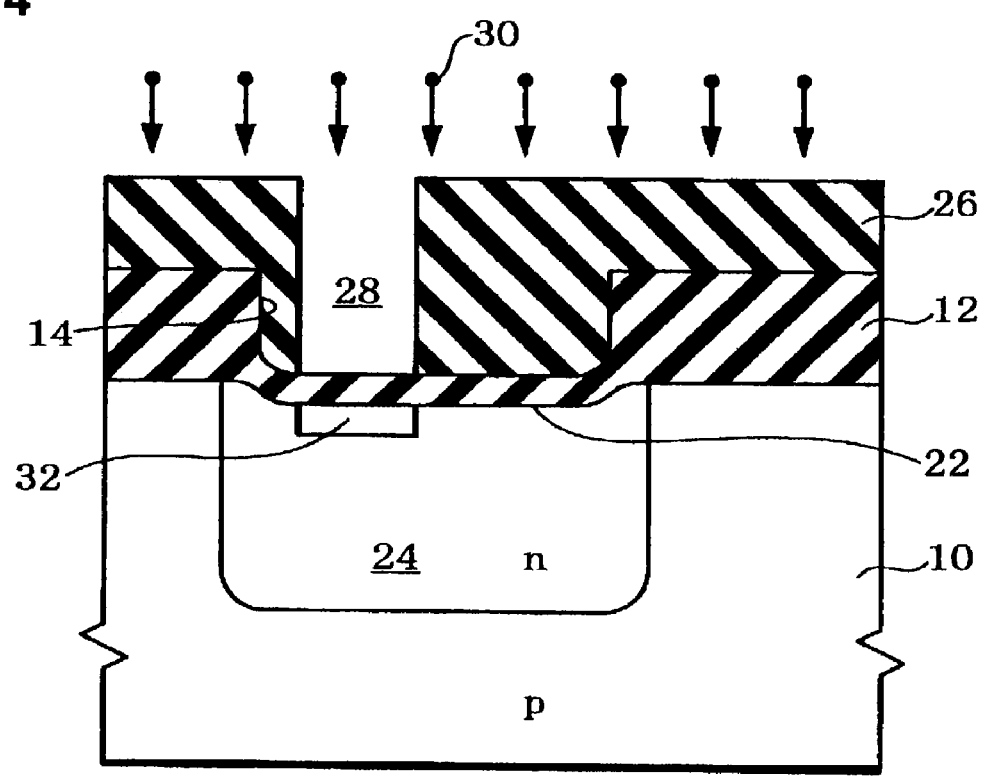
FIG. 4 shows a cross-sectional view of the embodiment of the present invention, and shows a state in which a second mask layer is formed, and an impurity layer is formed in the first well by implanting ions.

(e) As shown in FIG. 4, a second mask layer 26 having a second opening section 28 that is located at a specified position within the first opening section 14 is formed over the first mask layer 12. The second mask layer 26 may be composed of a resist layer, for example. Also, the second opening section 28 corresponds to a forming region of a second well that defines a shallow well in the triple well.

(f) As shown in FIG. 4, a second impurity 30 of the first conductivity type (p-type) is ion-implanted in the semiconductor substrate 10 through the second dielectric layer 22, using the second mask layer 26 as a mask to thereby form an impurity layer 32. For example, boron may be uses as the p-type impurity.

Figure 5:
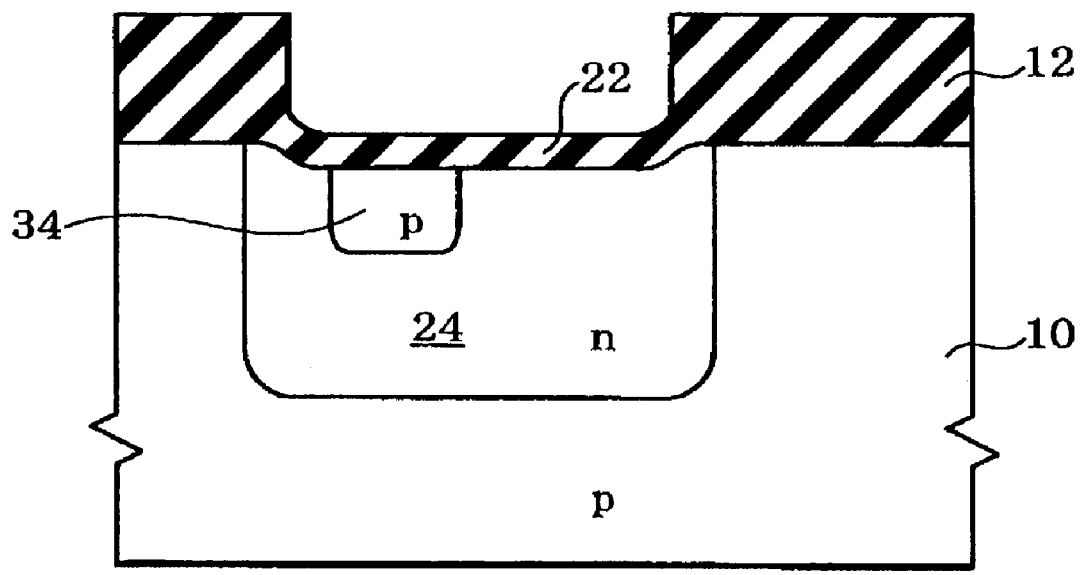
FIG. 5 shows a cross-sectional view of the embodiment of the present invention, and shows a state in which a second well is formed in the first well in the semiconductor substrate.

(g) As shown in FIG. 5, after removing the second mask layer 26 (see FIG. 4), a heat treatment is conducted to re-distribute the impurity in the impurity layer 32 (see FIG. 4) to form a second well 34. The heat treatment in this step is not limited to the case of re-distribution of impurity, but may also be conducted to recover damages to the crystal in the semiconductor substrate 10 caused by the ion implantation. In this step, if the second mask layer 26 includes organic substances like a resist layer, generation of contaminating substances by the heat treatment can be prevented by removing the second mask layer.

Figure 6:
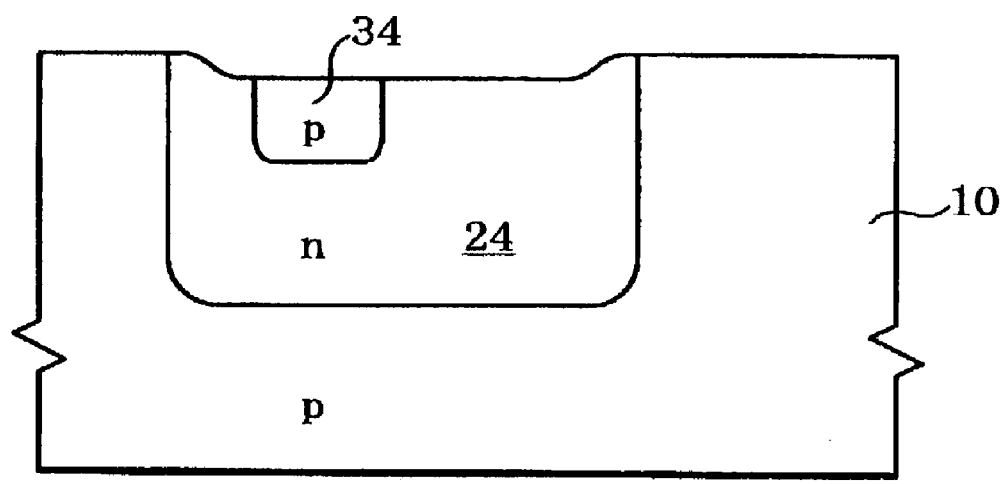
FIG. 6 shows a cross-sectional view of a triple well that is formed by a manufacturing method in accordance with the embodiment of the present invention.

(h) As shown in FIG. 6, the first mask layer 12 and the second dielectric layer 22 are removed by, for example, wet etching. In this manner, a triple well, in which the n-type first well 24 is formed in the p-type semiconductor substrate 10, and the p-type second well 34 is formed in the first well 24, can be formed.

Then, by a known method (not shown), element isolation layers, gate dielectric layers, gate electrodes, source/drain regions and the like are formed, such that an n-type MOS transistor in the p-type second well 34, and a p-type MOS transistor in the n-type first well 24 are formed.

In accordance with the embodiment of the present invention, the second dielectric layer 22 that is formed in the process of forming the first well 24 can be used without modification as a protective film in the ion implantation in the process of forming the second well 34. Accordingly, for example, the steps of forming a triple well can be reduced, compared to the case where a dielectric layer formed on a surface of the semiconductor substrate in forming a first well is removed, and then a protective dielectric layer necessary for the formation of a second well is formed anew.

In the example described above, the first conductivity type is p-type and the second conductivity type is n-type; however, the polarity of the conductivity type can be reversed without deviating from the scope of the present invention.

One embodiment of the present invention has been described above. However, the present invention is not limited to this embodiment, but many modifications can be made within the scope of the subject matter of the invention.

The entire disclosure of Japanese Patent Application No. 2002-060489 filed Mar. 6, 2002 is incorporated by reference herein.

What is claimed is:

1. A method for manufacturing a semiconductor device, comprising the steps of:
    (a) forming a first mask layer having a first opening section on a semiconductor substrate of a first conductivity type;
    (b) forming a first dielectric layer having a specified film thickness on an exposed surface of the semiconductor substrate in the first opening section after forming the first mask layer;
    (c) forming an impurity layer by introducing a first impurity of a second conductivity type by an ion implantation in the semiconductor substrate through the first dielectric layer, using the first mask layer as a mask;
    (d) conducting a heat treatment to form a first well by re-distributing the first impurity of the impurity layer, and forming a second dielectric layer having a specified film thickness that is thicker than the first dielectric layer on the exposed surface of the semiconductor substrate in the first opening section, thereby forming the first well and the second dielectric layer simultaneously;
    (e) forming a second mask layer on at least the first mask layer, the second mask layer having a second opening section that is located at a specified position in the first opening section on the first mask layer; and
    (f) forming a second well within the first well by introducing a second impurity of the first conductivity type by an ion implantation in the semiconductor substrate through the second dielectric layer using the second mask layer as a mask.

2. The method for manufacturing a semiconductor device according to claim 1, wherein the first dielectric layer is formed by thermally oxidizing the semiconductor substrate, and the second dielectric layer is formed by further thermally oxidizing the semiconductor substrate in the presence of the first dielectric layer.

3. The method for manufacturing a semiconductor device according to claim 1, wherein a film thickness of the second dielectric layer is controlled by a partial pressure of oxygen in the heat treatment of step (d).

4. The method for manufacturing a semiconductor device according to claim 1, wherein the first mask layer further comprises a silicon oxide layer, and the second mask layer further comprises a resist layer.

5. The method for manufacturing a semiconductor device according to claim 1, wherein, in step (d), a concave section is formed in a surface of the semiconductor substrate by forming the second dielectric layer.

6. The method for manufacturing a semiconductor device according to claim 1, wherein step (f) further includes the step of conducting a heat treatment to re-distribute the second impurity.

7. The method for manufacturing a semiconductor device according to claim 6, further comprising the step of removing the second mask layer before the heat treatment.

* * * * *